(12) United States Patent
Hwang et al.

(10) Patent No.: US 11,967,389 B2
(45) Date of Patent: Apr. 23, 2024

(54) SEMICONDUCTOR APPARATUS RELATED TO A TEST FUNCTION

(71) Applicant: SK hynix Inc., Icheon-si (KR)

(72) Inventors: Seon Woo Hwang, Icheon-si (KR); Seong Jin Kim, Icheon-si (KR); Jung Hwan Ji, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/737,268

(22) Filed: May 5, 2022

(65) Prior Publication Data

US 2023/0215508 A1 Jul. 6, 2023

(30) Foreign Application Priority Data

Jan. 3, 2022 (KR) .................. 10-2022-0000236

(51) Int. Cl.
| | |
|---|---|
| *G11C 29/14* | (2006.01) |
| *G11C 7/06* | (2006.01) |
| *G11C 7/10* | (2006.01) |
| *G11C 29/12* | (2006.01) |
| *G11C 29/42* | (2006.01) |
| *G11C 29/46* | (2006.01) |

(52) U.S. Cl.
CPC .............. *G11C 29/42* (2013.01); *G11C 7/065* (2013.01); *G11C 7/1069* (2013.01); *G11C 7/1096* (2013.01); *G11C 29/1201* (2013.01); *G11C 29/46* (2013.01)

(58) Field of Classification Search
CPC ....... G11C 29/42; G11C 7/065; G11C 7/1069; G11C 29/1201; G11C 29/46
See application file for complete search history.

(56) References Cited

U.S. PATENT DOCUMENTS

| | | | | |
|---|---|---|---|---|
| 2006/0117155 | A1* | 6/2006 | Ware | G06F 3/0673 |
| | | | | 711/163 |
| 2009/0067269 | A1* | 3/2009 | Wissel | G11C 29/846 |
| | | | | 365/200 |
| 2016/0358671 | A1* | 12/2016 | Lee | G11C 29/12015 |
| 2017/0352434 | A1 | 12/2017 | Ryu et al. | |
| 2020/0411086 | A1* | 12/2020 | Yim | G11C 11/5628 |
| 2021/0407611 | A1* | 12/2021 | Liang | G11C 7/222 |

FOREIGN PATENT DOCUMENTS

KR  1020120080352 A  7/2012

* cited by examiner

*Primary Examiner* — Min Huang
(74) *Attorney, Agent, or Firm* — WILLIAM PARK & ASSOCIATES LTD.

(57) ABSTRACT

The present technology may include a first storage circuit connected to a plurality of memory banks, an error correction circuit, a read path including a plurality of sub-read paths connected between the plurality of memory banks and the error correction circuit, and a control circuit configured to control data output from the plurality of memory banks to be simultaneously stored in the first storage circuit by deactivating the read path during a first sub-test section, and to control the data stored in the first storage circuit to be sequentially transmitted to the error correction circuit by sequentially activating the plurality of sub-read paths during a second sub-test section.

19 Claims, 10 Drawing Sheets

350

SEMICONDUCTOR APPARATUS RELATED TO A TEST FUNCTION

CROSS-REFERENCES TO RELATED APPLICATION

The present application claims priority under 35 U.S.C. § 119(a) to Korean application number 10-2022-0000236, filed on Jan. 3, 2022, in the Korean Intellectual Property Office, which is incorporated herein by reference in its entirety.

BACKGROUND

1. Technical Field

Various embodiments generally relate to a semiconductor circuit, and particularly, to a semiconductor apparatus related to a test function.

2. Related Art

In general, fail data is randomly generated in response to a reduction in the size of a semiconductor apparatus, for example, a memory apparatus, resulting in an increase in a soft error. Accordingly, in order to solve such a problem, a memory apparatus has an error correction code (ECC) function therein. The memory apparatus includes an ECC circuit for performing the ECC function, but only one ECC circuit is provided due to power consumption and area problems, and a plurality of unit memory blocks in the memory apparatus, for example, a plurality of memory banks are configured to share one ECC circuit.

Meanwhile, when fabrication processes for a memory apparatus are all completed, the memory apparatus is generally subjected to a memory apparatus test for measuring various characteristics of each memory apparatus formed on a semiconductor substrate. Through such a memory apparatus test, defects in a process such as a fabrication process or an assembly process of the semiconductor substrate are detected, which makes it possible to improve the productivity (throughput) of the memory apparatuses. Particularly, a parallel bit test (PBT) is performed as a method for reducing a test time. The parallel bit test may determine pass/fail by writing specific data in all memory cells during a write operation and comparing data output through global data lines during a read operation.

In order to perform the parallel bit test in the aforementioned structure in which a plurality of memory banks share one ECC circuit, all the memory banks need to be sequentially tested so that data of all the memory banks pass through the ECC circuit. For example, when a memory apparatus includes 16 memory banks, 16 tests need to be sequentially performed, causing a problem in that a test time is significantly increased.

SUMMARY

An embodiment of the present disclosure may include: a first storage circuit connected to a plurality of memory banks; an error correction circuit; a read path including a plurality of sub-read paths connected between the plurality of memory banks and the error correction circuit; and a control circuit configured to control data output from the plurality of memory banks to be simultaneously stored in the first storage circuit by deactivating the read path during a first sub-test section, and to control the data stored in the first storage circuit to be sequentially transmitted to the error correction circuit by sequentially activating the plurality of sub-read paths during a second sub-test section.

An embodiment of the present disclosure may include: a plurality of memory banks divided into a plurality of bank groups, the plurality of bank groups including at least a first bank group and a second bank group; a plurality of sense amplifiers configured to sense and amplify data output from memory banks connected to the plurality of sense amplifiers among the plurality of memory banks, and to transmit the amplified data to a read path; a first storage circuit connected to the plurality of sense amplifiers; an error correction circuit; a first sub-read path connected between the first bank group and the error correction circuit; a second sub-read path connected between the second bank group and the error correction circuit; a second storage circuit connected to the error correction circuit; and a control circuit configured to control data output from the plurality of memory banks to be simultaneously stored in the first storage circuit by deactivating the read path during a first sub-test section, and to control the data stored in the first storage circuit to be sequentially stored in the second storage circuit after being subjected to an error correction operation through the error correction circuit by sequentially activating the first sub-read path and the second sub-read path during a second sub-test section.

An embodiment of the present disclosure may include: a plurality of memory banks divided into a plurality of bank groups, the plurality of bank groups including at least a first bank group and a second bank group; a plurality of sense amplifiers configured to sense and amplify data output from memory banks connected to the plurality of sense amplifiers among the plurality of memory banks, and to transmit the amplified data to a read path; a first storage circuit directly connected to the plurality of sense amplifiers and configured to store data output from the plurality of sense amplifiers; an error correction circuit; a first sub-read path connected between the first bank group and the error correction circuit and activated in response to activation of one of a first control signal set and activation of a second control signal; a second sub-read path connected between the second bank group and the error correction circuit and activated in response to activation of a remaining one of the first control signal set and the activation of the second control signal; a second storage circuit connected to the error correction circuit and configured to store test data output from the error correction circuit by being activated in response to activation of a third control signal set; and a control circuit configured to deactivate the first control signal set and the second control signal during a first sub-test section, and to sequentially activate the one of the first control signal set and the remaining one of the first control signal set during a second sub-test section.

DETAILED DESCRIPTION

Hereinafter, embodiments of the present disclosure will be described in more detail with reference to the accompanying drawings.

Various embodiments are directed to providing a semiconductor apparatus capable of reducing a test time.

Figure 1:
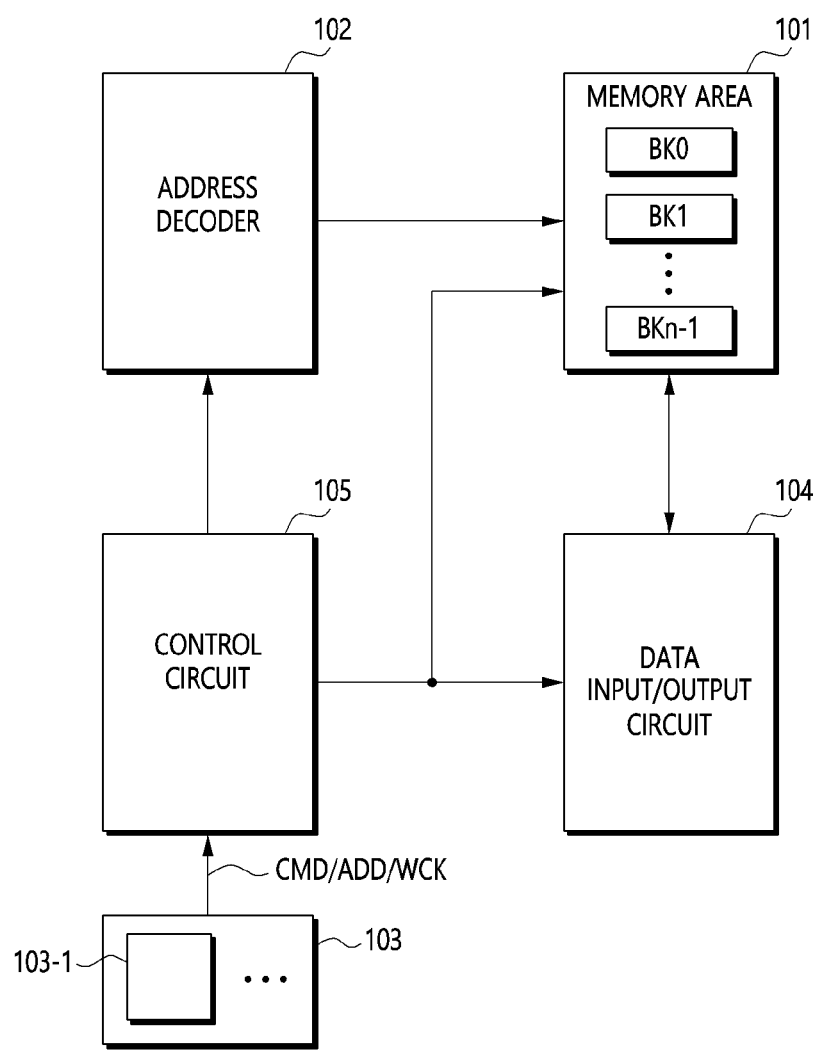
FIG. 1 is a diagram illustrating a configuration of a semiconductor apparatus in accordance with an embodiment of the present disclosure.

FIG. 1 is a diagram illustrating a configuration of a semiconductor apparatus 100 in accordance with an embodiment of the present disclosure.

The semiconductor apparatus 100 in accordance with an embodiment of the present disclosure may include a memory area 101, an address decoder 102, a pin array 103, a data input/output circuit 104, and a control circuit 105.

The memory area 101 may include a plurality of memory cells, and the plurality of memory cells may each include at least one of a volatile memory and a nonvolatile memory. Examples of the volatile memory may include a static RAM (SARM), a dynamic RAM (DARM), and a synchronous DRAM (SDARM), and examples of the nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and the like. During a read operation of the semiconductor apparatus 100, data stored in the memory area 101 may be output, and during a write operation of the semiconductor apparatus 100, data input from an external system, for example, a memory controller or test equipment may be stored in the memory area 101. The memory cells of the memory area 101 may be divided into a plurality of unit memory areas, for example, a plurality of memory banks BK0 to BKn-1.

The address decoder 102 may be connected to the control circuit 105 and the memory area 101. The address decoder 102 may decode an address signal provided by the control circuit 105, and access the memory area 101 in response to the decoding result.

The pin array 103 may include a plurality of pins 103-1. A command CMD, an address ADD, a clock signal WCK, and the like may be input through the plurality of pins 103-1.

The data input/output circuit 104 may be connected to the memory area 101. The data input/output circuit 104 may exchange data with an external system or the memory area 101. The data input/output circuit 104 may include a data input buffer, a data output buffer, a data input/output pad DQ, an ECC and test-related circuit, and the like.

The control circuit 105 may be connected to the memory area 101, the address decoder 102, and the data input/output circuit 104. The control circuit 105 may perform an ECC operation, a test operation, a read operation, a write operation, and an address processing-related control operation of the semiconductor apparatus 100. The control circuit 105 may receive the command CMD, the address ADD, the clock signal WCK, and the like through the plurality of pins 103-1.

The semiconductor apparatus 100 in accordance with an embodiment of the present disclosure may include a first storage circuit configured to store data output from the plurality of memory banks BK0 to BKn-1, an error correction circuit, and a read path including a plurality of sub-read paths connected between the plurality of memory banks BK0 to BKn-1 and the error correction circuit, and may control the data output from the plurality of memory banks to be simultaneously stored in the first storage circuit by deactivating the read path during a first sub-test section and control the data stored in the first storage circuit to be sequentially transmitted to the error correction circuit by sequentially activating the plurality of sub-read paths during a second sub-test section. The words "simultaneous" and "simultaneously" as used herein with respect to operations or occurrences mean that the operations or occurrences take place on overlapping intervals of time. For example, if a first operation or occurrence takes place over a first interval of time and a second operation or occurrence takes place simultaneously over a second interval of time, then the first and second intervals at least partially overlap each other such that there exists a time at which the first and second operations or occurrences are both taking place.

Figure 2:
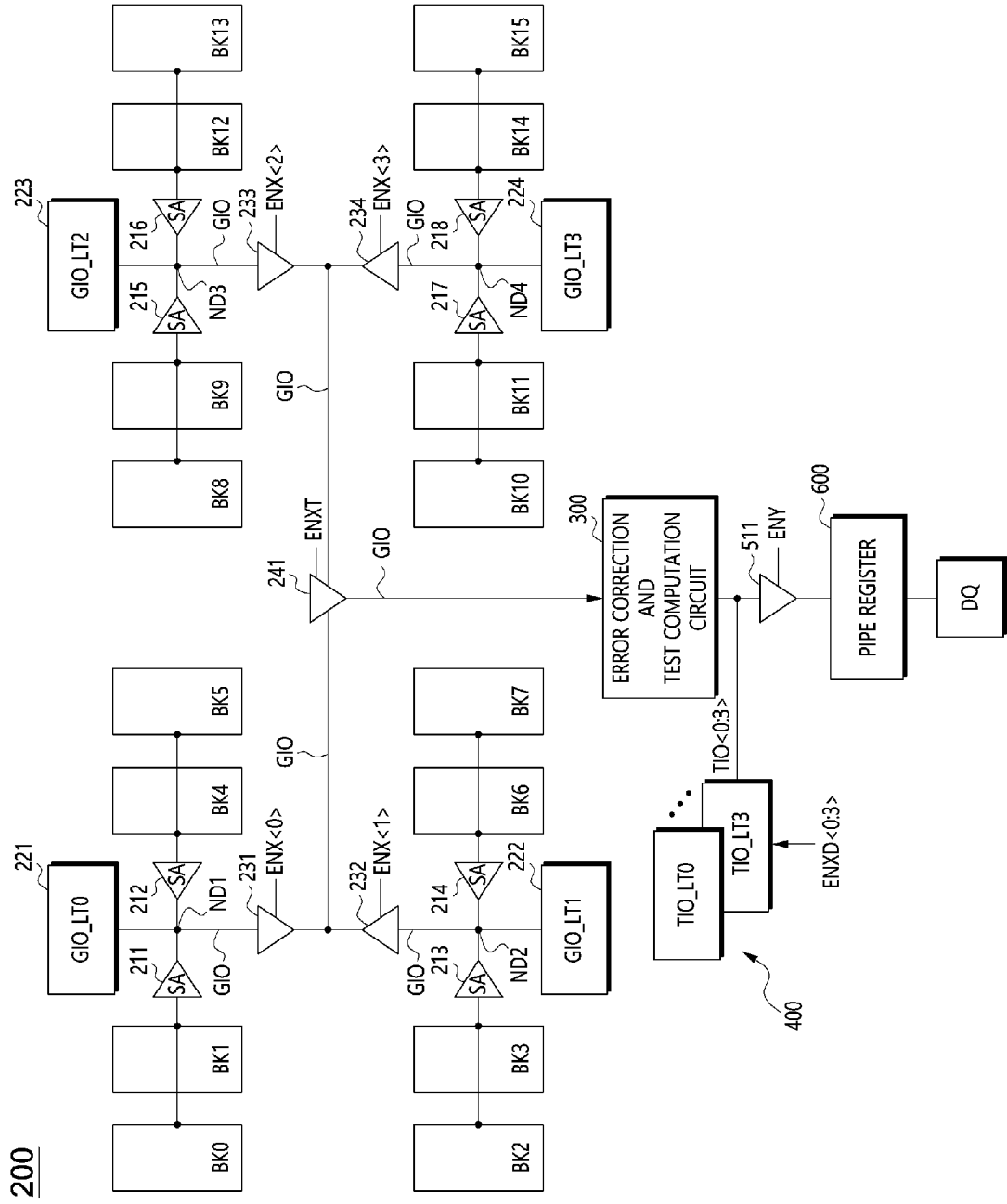
FIG. 2 is a diagram illustrating a configuration of a test circuit of the semiconductor apparatus in accordance with an embodiment of the present disclosure.

FIG. 2 is a diagram illustrating a configuration of a test circuit 200 in accordance with an embodiment of the present disclosure. FIG. 2 illustrates an example in which the number of the plurality of memory banks BK0 to BKn-1 in FIG. 1 is 16. A plurality of memory banks BK0 to BK15 may be divided into a plurality of bank groups, for example, a first bank group BK0, BK1, BK4, and BK5, a second bank group BK2, BK3, BK6, and BK7, a third bank group BK8, BK9, BK12, and BK13, and a fourth bank group BK10, BK11, BK14, and BK15. The order and the number of memory banks included in each bank group may vary according to an operation method of the semiconductor apparatus, for example, a burst length (BL) value or the like.

Referring to FIG. 2, the test circuit 200 of the semiconductor apparatus in accordance with an embodiment of the present disclosure may include the plurality of memory banks BK0 to BK15, a plurality of sense amplifiers 211 to 218, a first storage circuit 221 to 224, a read path, and an error correction and test computation circuit 300. The test circuit 200 in accordance with an embodiment of the present disclosure may further include a second storage circuit 400, a test data driver 511, and a pipe register 600.

The plurality of sense amplifiers 211 to 218 may be connected to the plurality of memory banks BK0 to BK15, may sense and amplify data output from memory banks connected to the plurality of sense amplifiers 211 to 218 among the plurality of memory banks BK0 to BK15, and transmit the amplified data to the read path. Output terminals of the sense amplifiers 211 and 212 connected to the first bank group BK0, BK1, BK4, and BK5 may be connected in common to a first node N1. Output terminals of the sense amplifiers 213 and 214 connected to the second bank group BK2, BK3, BK6, and BK7 may be connected in common to a second node N2. Output terminals of the sense amplifiers 215 and 216 connected to the third bank group BK8, BK9, BK12, and BK13 may be connected in common to a third node N3. Output terminals of the sense amplifiers 217 and 218 connected to the fourth bank group BK10, BK11, BK14, and BK15 may be connected in common to a fourth node N4.

The first storage circuit 221 to 224 may store output of the plurality of sense amplifiers 211 to 218. The first storage circuit 221 to 224 may be directly connected to the output terminals of the plurality of sense amplifiers 211 to 218, that is, the first to fourth nodes ND1 to ND4, respectively. The first storage circuit 221 to 224 may include a plurality of latch groups GIO_LT0 to GIO_LT3 (221 to 224), respectively. A first latch group 221 may be shared by the first bank group BK0, BK1, BK4, and BK5. A second latch group 222 may be shared by the second bank group BK2, BK3, BK6, and BK7. A third latch group 223 may be shared by the third bank group BK8, BK9, BK12, and BK13. A fourth latch group 224 may be shared by the fourth bank group BK10, BK11, BK14, and BK15. The first latch group 221 may be directly connected to the first node ND1. The first latch group 221 may store a signal applied to the first node ND1, that is, data output from a memory bank selected from the first bank group BK0, BK1, BK4, and BK5. The second latch group 222 may be directly connected to the second node ND2. The second latch group 222 may store a signal applied to the second node ND2, that is, data output from a memory bank selected from the second bank group BK2, BK3, BK6, and BK7. The third latch group 223 may be directly connected to the third node ND3. The third latch group 223 may store a signal applied to the third node ND3, that is, data output from a memory bank selected from the third bank group BK8, BK9, BK12, and BK13. The fourth latch group 224 may be directly connected to the fourth node ND4. The fourth latch group 224 may store a signal applied to the fourth node ND4, that is, data output from a memory bank selected from the fourth bank group BK10, BK11, BK14, and BK15. The first storage circuit 221 to 224 may operate as repeaters for improving the signal transmission performance of global input/output lines GIO during a normal operation of the semiconductor apparatus.

Some or all of circuit configurations on data transmission paths from the plurality of sense amplifiers 211 to 218 to the data input/output pad DQ may be referred to as the read path. The read path may be connected between the output terminals of the plurality of sense amplifiers 211 to 218, that is, the first to fourth nodes ND1 to ND4 and the error correction and test computation circuit 300. The read path may include the global input/output lines GIO and a plurality of global input/output line drivers 231 to 234 and 241 connected between the global input/output lines GIO. First to fourth global input/output line drivers 231 to 234 may be activated in response to a first control signal set ENX<0:3>, drive an input signal in an activated state, and output the driven input signal to a fifth global input/output line driver 241. The first global input/output line driver 231 may be activated in response to a first control signal ENX<0>. The second global input/output line driver 232 may be activated in response to a first control signal ENX<1>. The third global input/output line driver 233 may be activated in response to a first control signal ENX<2>. The fourth global input/output line driver 234 may be activated in response to a first control signal ENX<3>. The fifth global input/output line driver 241 may be activated in response to a second control signal ENXT, drive signals, which are output from the first to fourth global input/output line drivers 231 to 234, in an activated state, and transmit the driven signals to the error correction and test computation circuit 300.

The read path may include a plurality of sub-read paths. The plurality of sub-read paths may include first to fourth sub-read paths. The first sub-read path may include global input/output lines GIO on paths from the first node ND1 to the error correction and test computation circuit 300 and the global input/output line drivers 231 and 241. The second sub-read path may include global input/output lines GIO on paths from the second node ND2 to the error correction and test computation circuit 300 and the global input/output line drivers 232 and 241. The third sub-read path may include global input/output lines GIO on paths from the third node ND3 to the error correction and test computation circuit 300 and the global input/output line drivers 233 and 241. The fourth sub-read path may include global input/output lines GIO on paths from the fourth node ND4 to the error correction and test computation circuit 300 and the global input/output line drivers 234 and 241. The entire read path may be deactivated in response to the first control signal set ENX<0:3> and the second control signal ENXT. The first to fourth sub-read paths of the read path may be selectively activated in response to the first control signal set ENX<0:3> and the second control signal ENXT.

The error correction and test computation circuit 300 may perform an error correction operation and a test-related computational operation on data transmitted through the read path. The error correction operation may include an error correction code generation operation, and the test-related computational operation may include a data compression operation for a parallel bit test. The error correction and test computation circuit 300 may generate the first control signal set ENX<0:3>, the second control signal ENXT, a third control signal set ENXD<0:3>, and a fourth control signal ENY according to a read command and a clock signal provided from the outside of the semiconductor apparatus 100.

The second storage circuit 400 may be activated in response to the third control signal set ENXD<0:3>, and store data, which is output from the error correction and test computation circuit 300, in an activated state. The second storage circuit 400 may include a plurality of latch groups TIO_LT0 to TIO_LT3. A first latch group TIO_LT0 may be activated in response to a third control signal ENXD<0>, and store first test data TIO<0>, which corresponds to data transmitted through the first sub-read path among test data TIO<0:3> output from the error correction and test computation circuit 300, in an activated state. A second latch group TIO_LT1 may be activated in response to a third control signal ENXD<1>, and store second test data TIO<1>, which corresponds to data transmitted through the second sub-read path among the test data TIO<0:3> output from the error correction and test computation circuit 300, in an activated state. A third latch group TIO_LT2 may be activated in response to a third control signal ENXD<2>, and store third test data TIO<2>, which corresponds to data transmitted through the third sub-read path among the test data TIO<0:3> output from the error correction and test computation circuit 300, in an activated state. A fourth latch group TIO_LT3 may be activated in response to a third control signal ENXD<3>, and store fourth test data TIO<3>, which corresponds to data transmitted through the fourth sub-read path among the test data TIO<0:3> output from the error correction and test computation circuit 300, in an activated state.

The test data driver 511 may be activated in response to the fourth control signal ENY, drive the data, which is stored in the second storage circuit 400, in an activated state, and output the driven data to the pipe register 600.

The pipe register 600 may process the data, which is output from the test data driver 511, in a pipeline manner, and output the processed data to the outside of the semiconductor apparatus 100 through the data input/output pad DQ.

The first control signal set ENX<0:3>, the second control signal ENXT, the third control signal set ENXD<0:3>, and the fourth control signal ENY are test operation-related control signals, and logic levels of the test operation-related control signals may be adjusted to match the normal operation during the normal operation.

Figure 3:
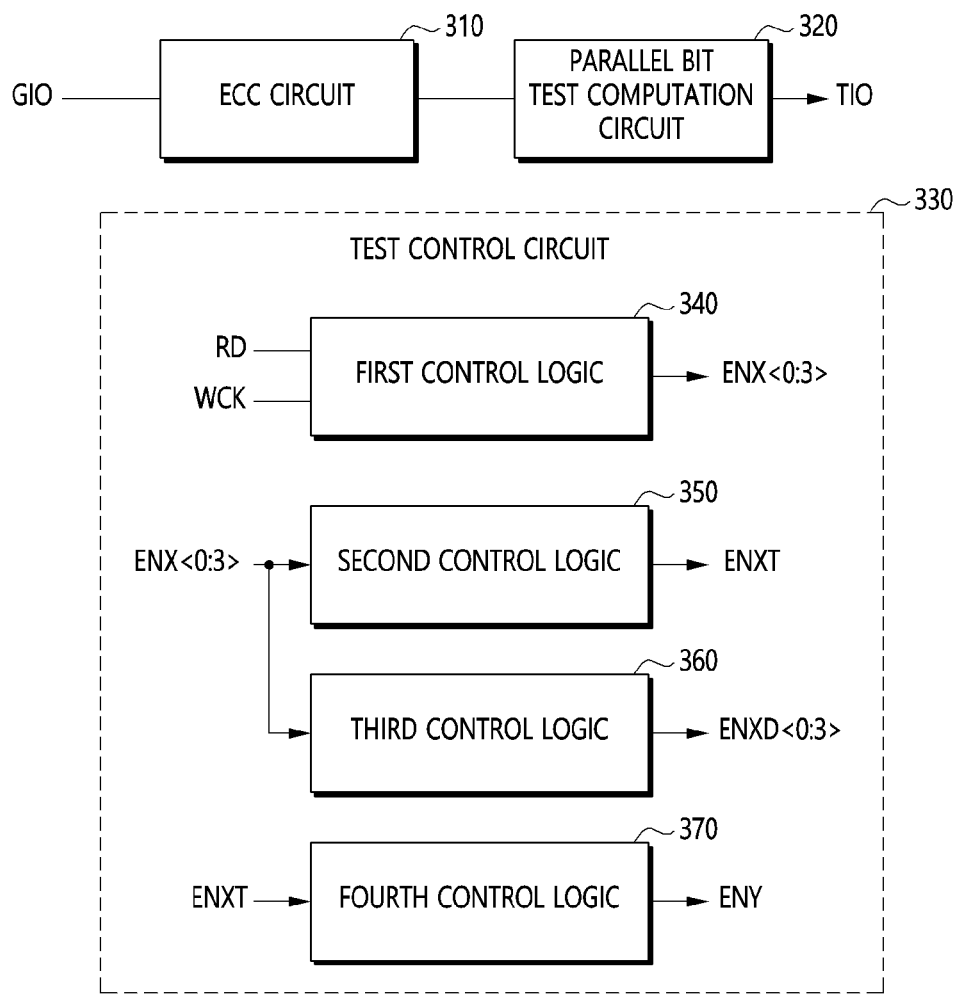
FIG. 3 is a diagram illustrating a configuration of an error correction and test computation circuit of FIG. 2.

FIG. 3 is a diagram illustrating a configuration of the error correction and test computation circuit 300 of FIG. 2.

Referring to FIG. 3, the error correction and test computation circuit 300 may include an error correction code (ECC) circuit 310 (hereinafter, referred to as an error correction circuit), a parallel bit test computation circuit 320, and a test control circuit 330.

The error correction circuit 310 may correct an error bit of data processed by the semiconductor apparatus 100, and include an ECC encoder and an ECC decoder. The ECC encoder may generate data, to which a parity bit is added, by performing error correction encoding on data. The ECC decoder may detect and correct an error included in data. The error correction circuit 310 may perform error correction by using coded modulation such as a low density parity check (LDPC) code, a BCH (Bose, Chaudhri, Hocquenghem) code, a turbo code, a Reed-Solomon code, a convolution code, a recursive systematic code (RSC), trellis-coded modulation (TCM), and block coded modulation (BCM).

The parallel bit test computation circuit 320 may compress the data, which is output from the error correction circuit 310, according to the parallel bit test.

The test control circuit 330 may generate the first control signal set ENX<0:3>, the second control signal ENXT, the third control signal set ENXD<0:3>, and the fourth control signal ENY according to a read command, that is, a read command RD provided from the outside of the semiconductor apparatus 100, and the clock signal WCK. The test control circuit 330 may include first to fourth control logics 340, 350, 360, and 370. The first control logic 340 may generate the first control signal set ENX<0:3> in response to the read command RD and the clock signal WCK. The second control logic 350 may generate the second control signal ENXT in response to the first control signal set ENX<0:3>. The third control logic 360 may generate the third control signal set ENXD<0:3> in response to the first control signal set ENX<0:3>. The fourth control logic 370 may generate the fourth control signal ENY in response to the second control signal ENXT.

Figure 4:
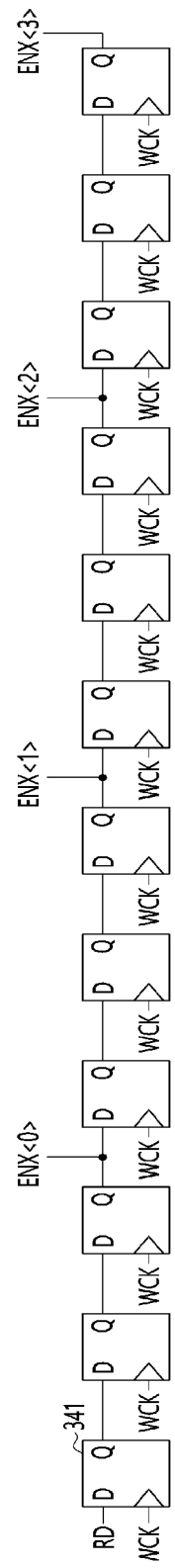
FIG. 4 is a diagram illustrating a configuration of a first control logic of FIG. 3.

FIG. 4 is a diagram illustrating a configuration of the first control logic 340 of FIG. 3.

Referring to FIG. 4, the first control logic 340 may include a plurality of flip-flops 341. The plurality of flip-flops 341 may generate the first control signal set ENX<0:3>, which is activated with a predetermined timing difference, by sequentially shifting the read command RD according to the clock signal WCK. The word "predetermined" as used herein with respect to a parameter, such as a predetermined timing difference, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 5:
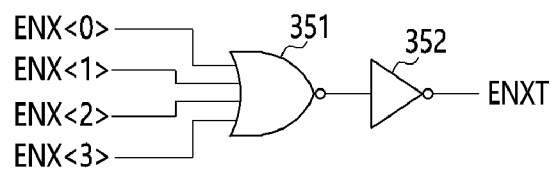
FIG. 5 is a diagram illustrating a configuration of a second control logic of FIG. 3.

FIG. 5 is a diagram illustrating a configuration of the second control logic 350 of FIG. 3.

Referring to FIG. 5, the second control logic 350 may include a first logic gate 351 and a second logic gate 352. The first logic gate 351 may NOR all bits of the first control signal set ENX<0:3> and output the NORed bits. The second logic gate 352 may invert the output of the first logic gate 351 and output the inverted output as the second control signal ENXT.

Figure 6:
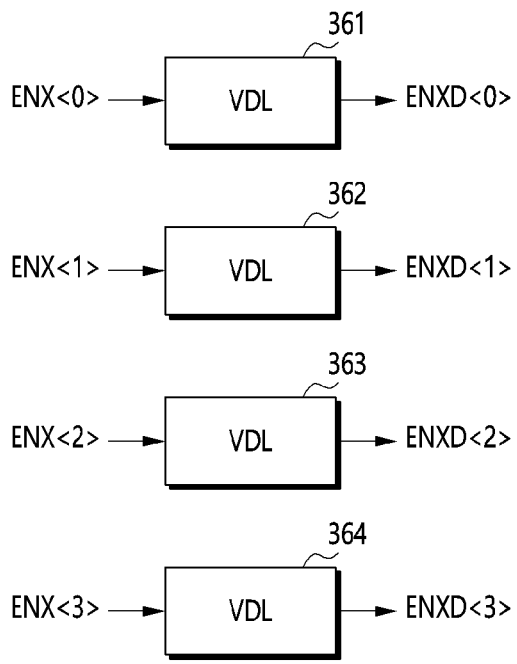
FIG. 6 is a diagram illustrating a configuration of a third control logic of FIG. 3.

FIG. 6 is a diagram illustrating a configuration of the third control logic 360 of FIG. 3.

Referring to FIG. 6, the third control logic 360 may include a plurality of variable delays 361 to 364. The plurality of variable delays 361 to 364 may generate the third control signal set ENXD<0:3> by delaying respective signal bits of the first control signal set ENX<0:3>. Respective delay times of the plurality of variable delays 361 to 364 may be adjusted through external control, for example, fuse programming using a test mode, in consideration of an operation timing of the second storage circuit 400.

Figure 7:
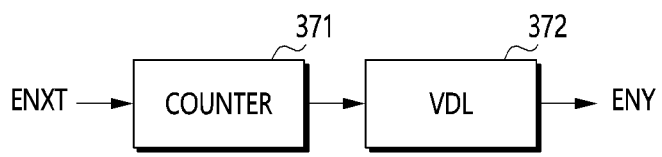
FIG. 7 is a diagram illustrating a configuration of a fourth control logic of FIG. 3.

FIG. 7 is a diagram illustrating a configuration of the fourth control logic 370 of FIG. 3.

Referring to FIG. 7, the fourth control logic 370 may include a counter 371 and a variable delay 372. The counter 371 may activate an output signal by counting a pulse of the second control signal ENXT. The counter 371 may activate the output signal by counting, for example, the rising edge of an $N^{th}$ pulse of the second control signal ENXT. The variable delay 372 may generate the fourth control signal ENY by delaying the output signal of the counter 371. In such a case, the N and the delay time of the variable delay 372 may be set and adjusted in consideration of an operation timing of the test data driver 511.

Figure 8:
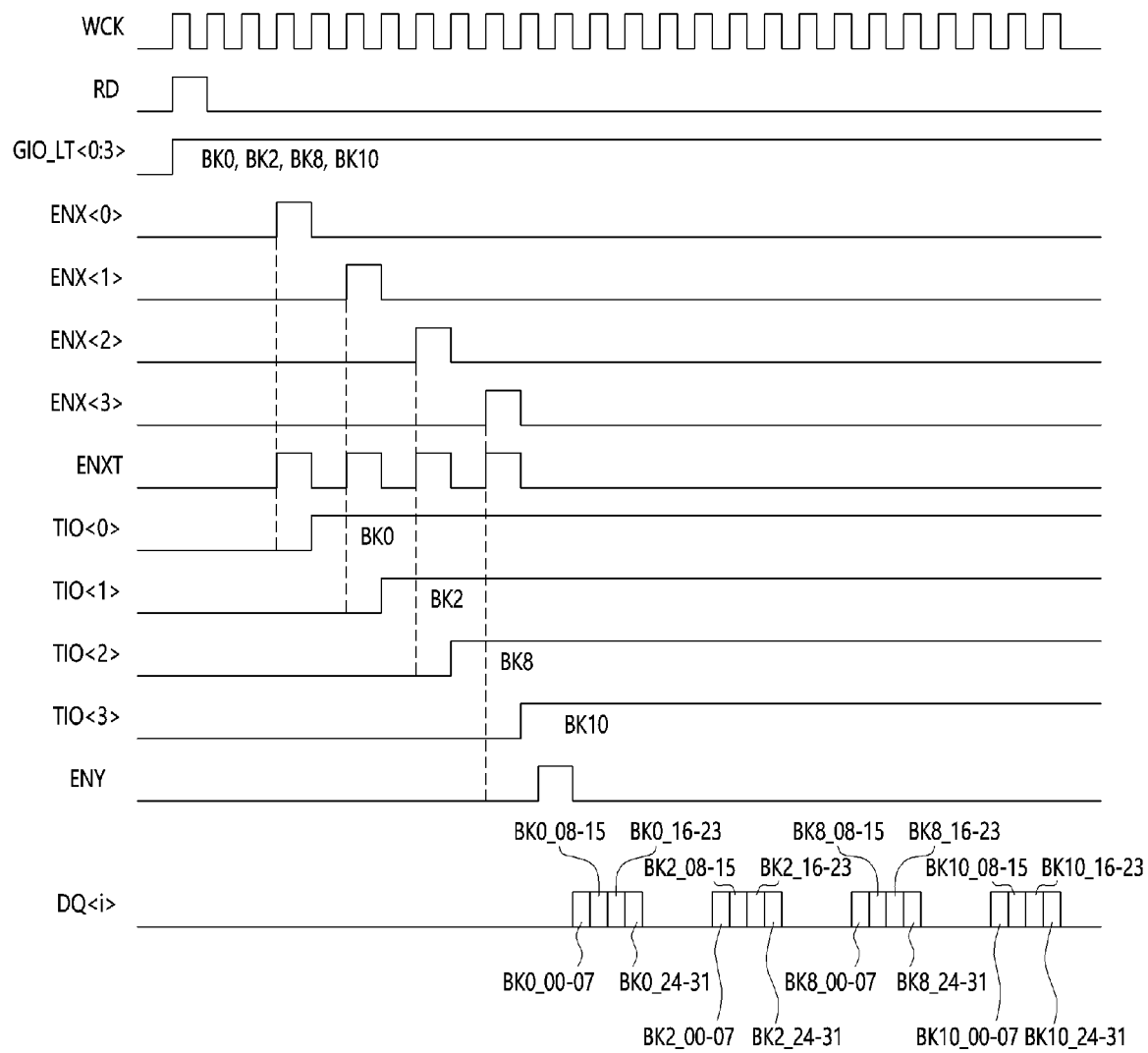
FIG. 8 is a timing diagram illustrating a test method of the semiconductor apparatus in accordance with an embodiment of the present disclosure.
Figure 9:
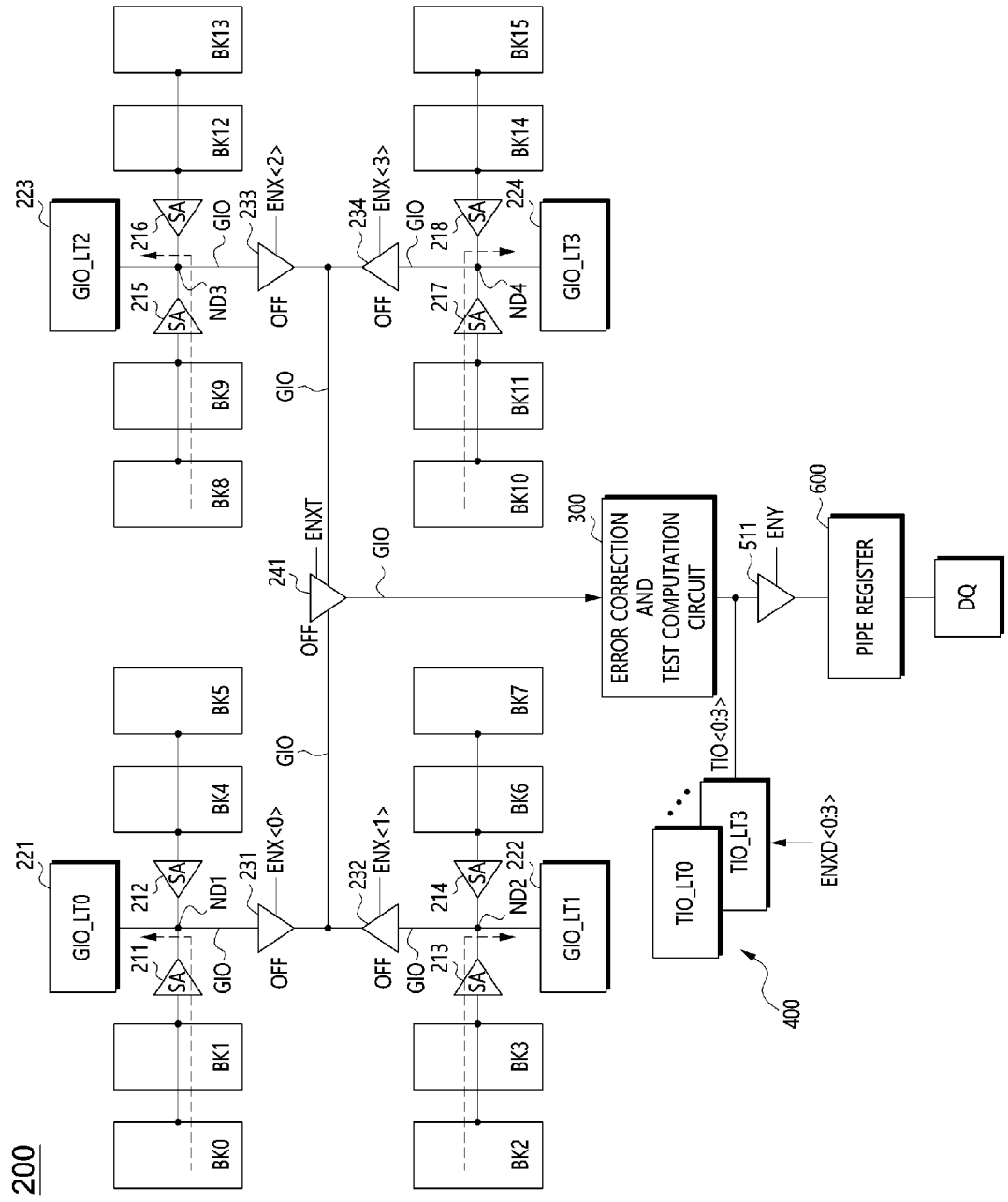
FIGS. 9, 10, and FIG. 11 are diagrams illustrating operation states in respective test steps of a test circuit of the semiconductor apparatus in accordance with an embodiment of the present disclosure.
Figure 10:
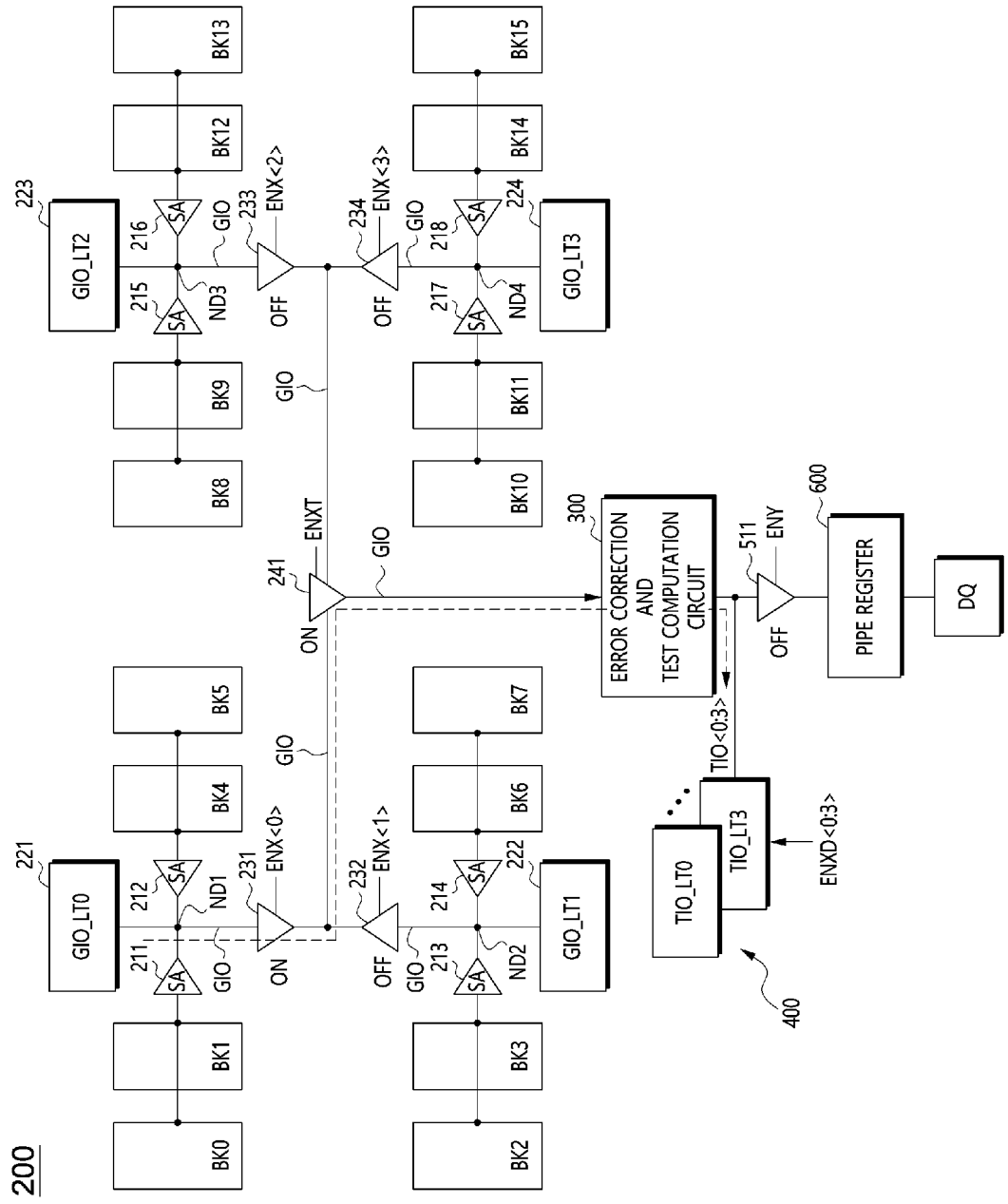
Figure 11:
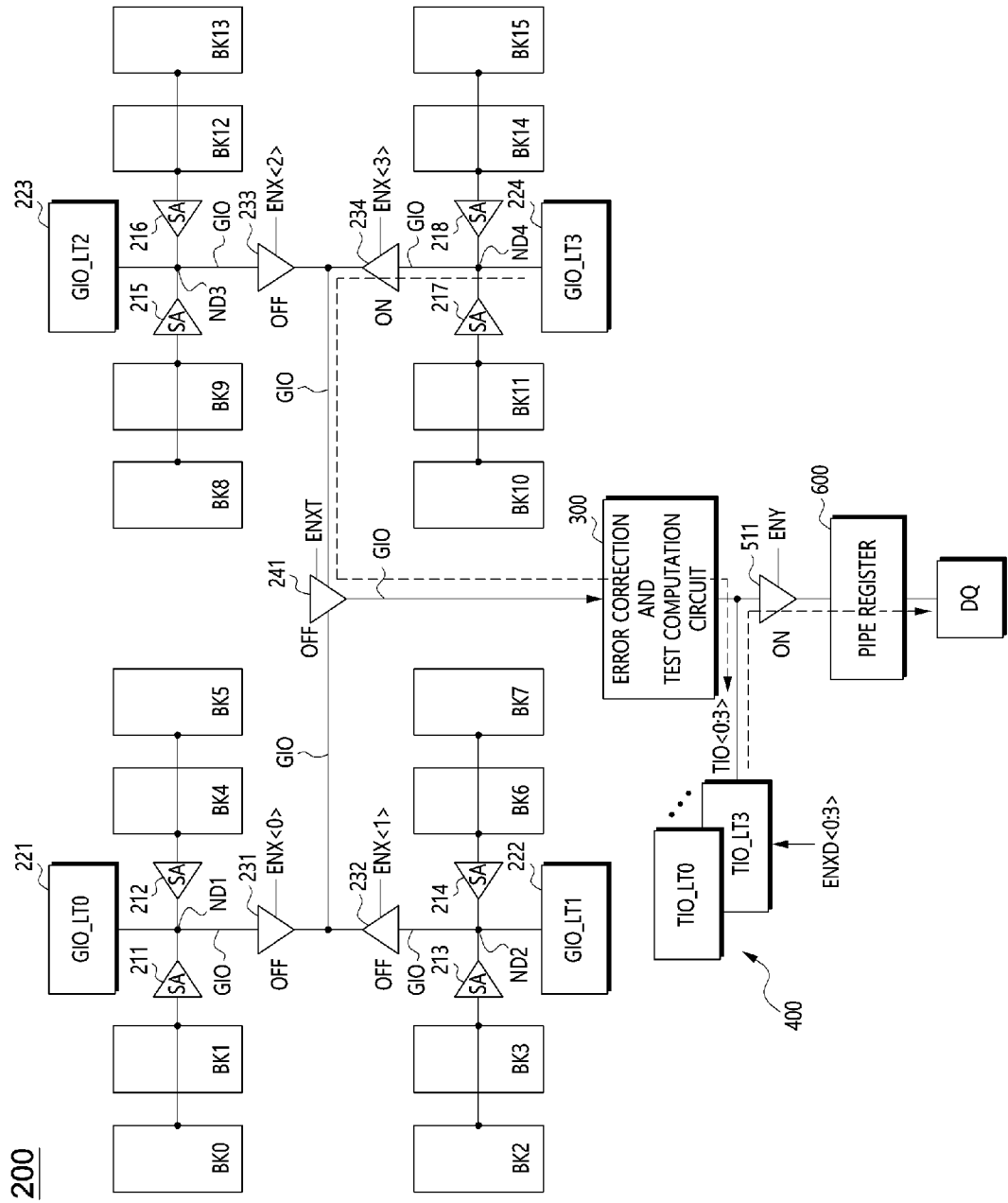

FIG. 8 is a timing diagram illustrating a test method of the semiconductor apparatus in accordance with an embodiment of the present disclosure, and FIG. 9 to FIG. 11 are diagrams illustrating operation states in respective test steps of a test circuit of the semiconductor apparatus in accordance with an embodiment of the present disclosure.

Hereinafter, a test method of the semiconductor apparatus in accordance with an embodiment of the present disclosure will be described with reference to FIG. 8 to FIG. 11.

The test of the semiconductor apparatus in accordance with an embodiment of the present disclosure may be performed on all of the plurality of memory banks BK0 to BK15. However, due to problems of a physical limitation of the semiconductor apparatus 100, that is, global input/output line sharing and the like, data output may not be simultaneously performed from all of the plurality of memory banks BK0 to BK15. Accordingly, in an embodiment of the present disclosure, one memory bank is selected from each of the first to fourth bank groups in response to a one-time read command and a total of four memory banks are simultaneously tested. In such a case, the number of memory banks that may be simultaneously tested may be changed according to a semiconductor apparatus design method.

The test operation of the semiconductor apparatus in accordance with the embodiment of the present disclosure may be divided into a plurality of sub-test sections, for example, first to third sub-test sections.

Prior to the first sub-test section, data having a predetermined pattern, that is, data having a value already known by an external system connected to the semiconductor apparatus 100 may be written in all of the plurality of memory banks BK0 to BK15.

Hereinafter, the first sub-test section will be described with reference to FIG. 8 and FIG. 9.

The first sub-test section may be a section for simultaneously storing, in the first storage circuit 221 to 224, respective data output from a plurality of memory banks, that is, memory banks selected from each of the first bank group BK0, BK1, BK4, and BK5, the second bank group BK2, BK3, BK6, and BK7, the third bank group BK8, BK9, BK12, and BK13, and the fourth bank group BK10, BK11, BK14, and BK15 one by one in a state where the read path is deactivated according to the read command RD input based on the clock signal WCK.

As the read command RD is input during the first sub-test section, the semiconductor apparatus 100 may activate the first memory bank BK0, the third memory bank BK2, the ninth memory bank BK8, the eleventh memory bank BK10, the first sense amplifier 211, the third sense amplifier 213, the fifth sense amplifier 215, and the seventh sense amplifier 217. Data respectively output from the first memory bank BK0, the third memory bank BK2, the ninth memory bank BK8, and the eleventh memory bank BK10 may be output through the first sense amplifier 211, the third sense amplifier 213, the fifth sense amplifier 215, and the seventh sense amplifier 217, respectively. Meanwhile, since the first control signal set ENX<0:3>, the second control signal ENXT, the third control signal set ENXD<0:3>, and the fourth control signal ENY are all in a deactivated state, all of the plurality of global input/output line drivers 231 to 234 and 241 substantially maintain a turn-off state (OFF). Since all of the plurality of global input/output line drivers 231 to 234 and 241 are in the turn-off state, the data output from the first sense amplifier 211, the third sense amplifier 213, the fifth sense amplifier 215, and the seventh sense amplifier 217 may be simultaneously stored in the first to fourth latch groups GIO_LT<0:3>. That is, an operation in which the data output from the first memory bank BK0 is stored in the first latch group GIO_LT<0>, an operation in which the data output from the third memory bank BK2 is stored in the second latch group GIO_LT<1>, an operation in which the data output from the ninth memory bank BK8 is stored in the third latch group GIO_LT<2>, and an operation in which the data output from the eleventh memory bank BK10 is stored in the fourth latch group GIO_LT<3> may be simultaneously performed.

Hereinafter, the second sub-test section will be described with reference to FIG. 8 and FIG. 10.

The second sub-test section may be a section for sequentially transmitting the data stored in the first to fourth latch groups GIO_LT<0:3> to the error correction and test computation circuit 300 by sequentially activating the plurality of sub-read paths, generating the test data TIO<0:3> by performing an error correction operation and a compression operation for a parallel bit test, and storing the test data TIO<0:3> in the second storage circuit 400.

After the read command RD is input and a predetermined timing reaches, the first control signal set ENX<0:3> and the second control signal ENXT may be sequentially activated. As the first control signal ENX<0> and the second control signal ENXT are activated, the first global input/output line driver 231 and the fifth global input/output line driver 241 may be turned on (ON) to transmit the data stored in the first latch group GIO_LT0 to the error correction and test computation circuit 300. The error correction and test computation circuit 300 may generate the first test data TIO<0> by performing an error correction operation and a compression operation on the data transmitted from the first latch group GIO_LT0. The second storage circuit 400 may store the first test data TIO<0> in the first latch group TIO_LT0, which corresponds to the first test data TIO<0> among the plurality of latch groups TIO_LT0 to TIO_LT3, in response to the third control signal ENXD<0> delayed compared to the first control signal ENX<0>.

Subsequently, as the first control signal ENX<1> and the second control signal ENXT are activated, the second global input/output line driver 232 and the fifth global input/output line driver 241 may be turned on (ON) to transmit the data stored in the second latch group GIO_LT1 to the error correction and test computation circuit 300. The error correction and test computation circuit 300 may generate the second test data TIO<1> by performing an error correction operation and a compression operation on the data transmitted from the second latch group GIO_LT1. The second storage circuit 400 may store the second test data TIO<1> in the second latch group TIO_LT1, which corresponds to the second test data TIO<1> among the plurality of latch groups TIO_LT0 to TIO_LT3, in response to the third control signal ENXD<1> delayed compared to the first control signal ENX<1>.

Subsequently, as the first control signal ENX<2> and the second control signal ENXT are activated, the third global input/output line driver 233 and the fifth global input/output line driver 241 may be turned on (ON) to transmit the data stored in the third latch group GIO_LT2 to the error correction and test computation circuit 300. The error correction and test computation circuit 300 may generate the third test data TIO<2> by performing an error correction operation and a compression operation on the data transmitted from the third latch group GIO_LT2. The second storage circuit 400 may store the third test data TIO<2> in the third latch group TIO_LT2, which corresponds to the third test data TIO<2> among the plurality of latch groups TIO_LT0 to TIO_LT3, in response to the third control signal ENXD<2> delayed compared to the first control signal ENX<2>.

Subsequently, as the first control signal ENX<3> and the second control signal ENXT are activated, the fourth global input/output line driver 234 and the fifth global input/output line driver 241 may be turned on (ON) to transmit the data stored in the fourth latch group GIO_LT3 to the error correction and test computation circuit 300. The error correction and test computation circuit 300 may generate the fourth test data TIO<3> by performing an error correction operation and a compression operation on the data transmitted from the fourth latch group GIO_LT3. The second storage circuit 400 may store the fourth test data TIO<3> in the fourth latch group TIO_LT3, which corresponds to the fourth test data TIO<3> among the plurality of latch groups TIO_LT0 to TIO_LT3, in response to the third control signal ENXD<3> delayed compared to the first control signal ENX<3>.

Hereinafter, the third sub-test section will be described with reference to FIG. 8 and FIG. 11.

The third sub-test section may be a section for simultaneously outputting the first to fourth test data TIO<0:3> stored in the second storage circuit 400 to the outside of the semiconductor apparatus 100 through the data input/output pad DQ.

As the fourth control signal ENY is activated after the last pulse of the second control signal ENXT, the test data driver 511 may be turned on (ON) to drive and output the first to fourth test data TIO<0:3> stored in the second storage circuit 400. The output signals of the test data driver 511 may be output to the outside of the semiconductor apparatus 100 through a data input/output pad DQ<i> via the pipe register 600. For example, when a read operation of the semiconductor apparatus 100 is performed with BL32, 32-bit data output from each memory bank may be compressed in units of 8 bits via the error correction and test computation circuit 300, and 4-bit test data BK0_00-07/BK0_08-15/BK0_16-23/BK0_24-31 corresponding to the first memory bank BK0 may be sequentially output through the data input/output pad DQ<i>. Subsequently, 4-bit test data corresponding to the third memory bank BK2, the ninth memory bank BK8, and the eleventh memory bank BK10 may be output in substantially the same manner.

In such a case, an operation in which the test data driver 511 drives the first to fourth test data TIO<0:3> stored in the second storage circuit 400 may be started at substantially the same timing as the operation of transmitting the data stored in the fourth latch group GIO_LT3 to the error correction and test computation circuit 300 in the second sub-test section, which uses a timing margin that occurs when the pipe register 600 sequentially processes input signals in a pipeline manner.

As described above, the embodiment of the present disclosure described with reference to FIG. 8 to FIG. 11 relates to an example of simultaneously performing a test on a total of four memory banks BK0, BK2, BK8, and BK10 obtained by selecting a memory bank from each of the first to fourth bank groups one by one in response to a one-time read command, and tests on the memory banks BK4, BK6, BK12, and BK14, the memory banks BK1, BK3, BK9, and BK11, and the memory banks BK5, BK7, BK13, and BK15 may be performed in substantially the same manner as described above according to subsequent read commands. Consequently, a test time may be significantly reduced in a structure in which a plurality of memory banks share one ECC circuit.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all modifications or modified forms derived from the equivalent concept thereof are included in the scope of the present disclosure.

What is claimed is:

1. A semiconductor apparatus comprising:
    a first storage circuit located outside a plurality of memory banks and connected to the plurality of memory banks;
    an error correction circuit configured to correct an error bit of data output from the plurality of memory banks;
    a read path including a plurality of sub-read paths, one side terminals of the plurality of sub-read paths are connected to the plurality of memory banks and the first storage circuit in common and other side terminals of the plurality of sub-read paths are connected to the error correction circuit; and
    a control circuit configured to control the data output from the plurality of memory banks to be simultaneously stored in the first storage circuit by deactivating the read path during a first sub-test section, and to control the data stored in the first storage circuit to be sequentially transmitted to the error correction circuit by sequentially activating the plurality of sub-read paths during a second sub-test section.

2. The semiconductor apparatus according to claim 1, wherein the first storage circuit comprises:
    a first latch group shared by a first bank group among the plurality of memory banks; and
    a second latch group shared by a second bank group among the plurality of memory banks.

3. The semiconductor apparatus according to claim 2, wherein the plurality of sub-read paths comprise:
    a first sub-read path including first global input/output lines connected between the first bank group and the error correction circuit, and a plurality of global input/output line drivers coupled between the first global input/output lines; and
    a second sub-read path including second global input/output lines connected between the second bank group and the error correction circuit, and a plurality of global input/output line drivers coupled between the second global input/output lines.

4. The semiconductor apparatus according to claim 1, wherein the read path includes global input/output lines and a plurality of global input/output line drivers coupled between the global input/output lines.

5. The semiconductor apparatus according to claim 4, wherein the control circuit controls the data output from the plurality of memory banks to be simultaneously stored in the first storage circuit by deactivating all the plurality of global input/output line drivers during the first sub-test section.

6. A semiconductor apparatus comprising:
    a plurality of memory banks divided into a plurality of bank groups, the plurality of bank groups including at least a first bank group and a second bank group;
    a plurality of sense amplifiers configured to sense and amplify data output from memory banks connected to the plurality of sense amplifiers among the plurality of memory banks, and to transmit the amplified data;
    a first storage circuit located outside the plurality of memory banks and connected to the plurality of sense amplifiers;
    an error correction circuit configured to correct an error bit of data output from the plurality of memory banks;
    a first sub-read path, one side terminals of the first sub-read path are connected to the first bank group and the first storage circuit in common and other side terminals of the first sub-read path are connected to the error correction circuit;
    a second sub-read path, one side terminals of the second sub-read path are connected to the second bank group and the first storage circuit in common and other side terminals of the second sub-read path are connected to the error correction circuit;
    a second storage circuit connected to an output terminal of the error correction circuit; and
    a control circuit configured to control the amplified data to be simultaneously stored in the first storage circuit by deactivating the first sub-read path and the second sub-read path during a first sub-test section, and to control the data stored in the first storage circuit to be sequentially stored in the second storage circuit after being subjected to an error correction operation through the error correction circuit by sequentially activating the first sub-read path and the second sub-read path during a second sub-test section.

7. The semiconductor apparatus according to claim 6, further comprising:
    a test data driver configured to output the data stored in the second storage circuit to an outside of the semiconductor apparatus through a data input/output pad after the second sub-test section ends.

8. The semiconductor apparatus according to claim 7, further comprising:
    a parallel bit test computation circuit configured to compress data, which is output from the error correction circuit, according to a parallel bit test, and to transmit the compressed data to the test data driver.

9. The semiconductor apparatus according to claim 6, wherein the first storage circuit comprises:
a first latch group shared by the first bank group; and
a second latch group shared by the second bank group.

10. The semiconductor apparatus according to claim 6, wherein the first sub-read path and the second sub-read path each include global input/output lines and a plurality of global input/output line drivers coupled between the global input/output lines.

11. The semiconductor apparatus according to claim 10, wherein the control circuit controls the data output from the plurality of memory banks to be simultaneously stored in the first storage circuit by deactivating all of the plurality of global input/output line drivers during the first sub-test section.

12. A semiconductor apparatus comprising:
a plurality of memory banks divided into a plurality of bank groups, the plurality of bank groups including at least a first bank group and a second bank group;
a plurality of sense amplifiers configured to sense and amplify data output from memory banks connected to the plurality of sense amplifiers among the plurality of memory banks, and to transmit the amplified data;
a first storage circuit located outside the plurality of memory banks and directly connected to the plurality of sense amplifiers and configured to store data output from the plurality of sense amplifiers;
an error correction circuit configured to correct an error bit of data output from the plurality of memory banks;
a first sub-read path, one side terminals of the first sub-read path are connected to the first bank group and the first storage circuit in common and other side terminals of the first sub-read path are connected to the error correction circuit and activated in response to activation of one of a first control signal set and activation of a second control signal;
a second sub-read path, one side terminals of the second sub-read path are connected to the second bank group and the first storage circuit in common and other side terminals of the second sub-read path are connected to the error correction circuit and activated in response to activation of a remaining one of the first control signal set and the activation of the second control signal;
a second storage circuit connected to an output terminal of the error correction circuit and configured to store test data output from the error correction circuit by being activated in response to activation of a third control signal set; and
a control circuit configured to deactivate the first control signal set and the second control signal during a first sub-test section, and to sequentially activate the one of the first control signal set and the remaining one of the first control signal set during a second sub-test section.

13. The semiconductor apparatus according to claim 12, wherein the first storage circuit comprises:
a first latch group shared by the first bank group; and
a second latch group shared by the second bank group.

14. The semiconductor apparatus according to claim 12, wherein the first sub-read path includes first global input/output lines and a plurality of global input/output line drivers, coupled between the first global input/output lines, activated in response to the one of the first control signal set and the second control signal, and
the second sub-read path includes second global input/output lines and a plurality of global input/output line drivers, coupled between the second global input/output lines, activated in response to the remaining one of the first control signal set and the second control signal.

15. The semiconductor apparatus according to claim 12, wherein the control circuit is configured to sequentially activate the third control signal set after the activation of the first control signal set in the second sub-test section.

16. The semiconductor apparatus according to claim 15, wherein the control circuit comprises:
a first control logic configured to generate the first control signal set in response to a read command and a clock signal;
a second control logic configured to generate the second control signal in response to the first control signal set; and
a third control logic configured to generate the third control signal set in response to the first control signal set.

17. The semiconductor apparatus according to claim 12, further comprising:
a test data driver configured to output the data stored in the second storage circuit to an outside of the semiconductor apparatus through a data input/output pad by being activated in response to a fourth control signal in a third sub-test section.

18. The semiconductor apparatus according to claim 17, wherein the control circuit is configured to activate the fourth control signal during the third sub-test section.

19. The semiconductor apparatus according to claim 17, further comprising:
a parallel bit test computation circuit configured to compress data, which is output from the error correction circuit, according to a parallel bit test, and to transmit the compressed data to the test data driver.

* * * * *